US006281583B1

United States Patent
Dirahoui et al.

(10) Patent No.: US 6,281,583 B1
(45) Date of Patent: Aug. 28, 2001

(54) PLANAR INTEGRATED CIRCUIT INTERCONNECT

(75) Inventors: Bachir Dirahoui, Mount Kisco; Daniel C. Edelstein, New Rochelle; Robert C. Greenlese, Lagrangeville; Harris C. Jones, Stormville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/310,479

(22) Filed: May 12, 1999

(51) Int. Cl.[7] .................................................. H01L 23/48
(52) U.S. Cl. ........................ 257/752; 257/758; 257/774
(58) Field of Search ..................................... 257/752, 758, 257/759, 773, 774

(56) References Cited

U.S. PATENT DOCUMENTS

| 4,911,796 | 3/1990 | Reed | 204/15 |
|---|---|---|---|
| 5,208,068 | 5/1993 | Davis et al. | 427/97 |
| 5,616,959 | * 4/1997 | Jeng | 257/758 |
| 5,625,232 | 4/1997 | Numata et al. | 257/758 |
| 5,675,187 | 10/1997 | Numata et al. | 257/758 |
| 6,051,869 | * 4/2000 | Pan et al. | 257/506 |
| 6,211,569 | * 4/2001 | Lou | 257/758 |

OTHER PUBLICATIONS

Chiang, Ting–Yen et al., "Effect of Via Separation and Low–K Dielectric Materials on the Thermal Characteristics of Cu Interconnects," IEEE IEDM Tech. Digest, Dec. 2000, pp. 261–264.*

"Interconnect Fabrication Processes and the Development of Low–Cost Wiring for CMOS Products" by Licata et al., IBM J. Res. Develop. vol. 39 No. 4, Jul. 1995, pp. 419–435.

* cited by examiner

Primary Examiner—T. N. Quach
(74) Attorney, Agent, or Firm—Ratner & Prestia; Tiffany L. Townsend, Esq.

(57) ABSTRACT

A semiconductor device having a planar integrated circuit interconnect and process of fabrication. The planar integrated circuit comprises a substrate having a first line wire formed in the substrate, a dielectric layer formed on the substrate, a second line wire formed in the dielectric layer, a contact via formed within the dielectric layer extending through the dielectric layer from the second line wire to the first line wire, and a dummy via which extends into the dielectric layer and is filled with a low dielectric material.

10 Claims, 4 Drawing Sheets

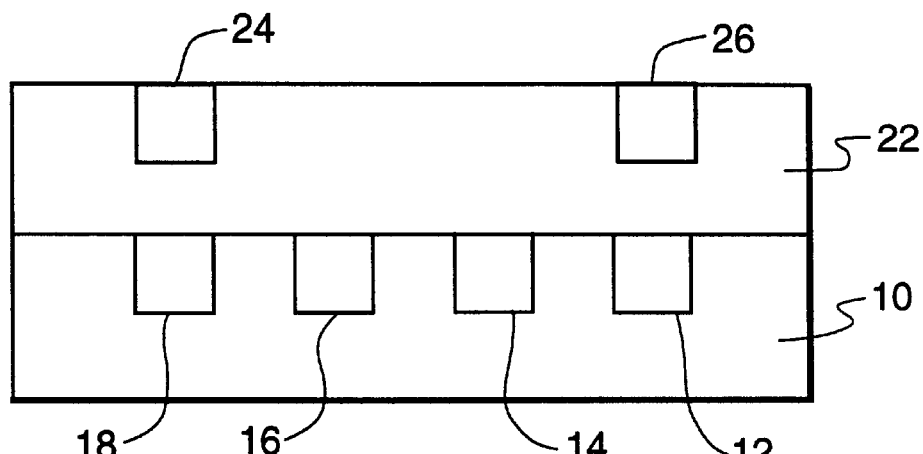
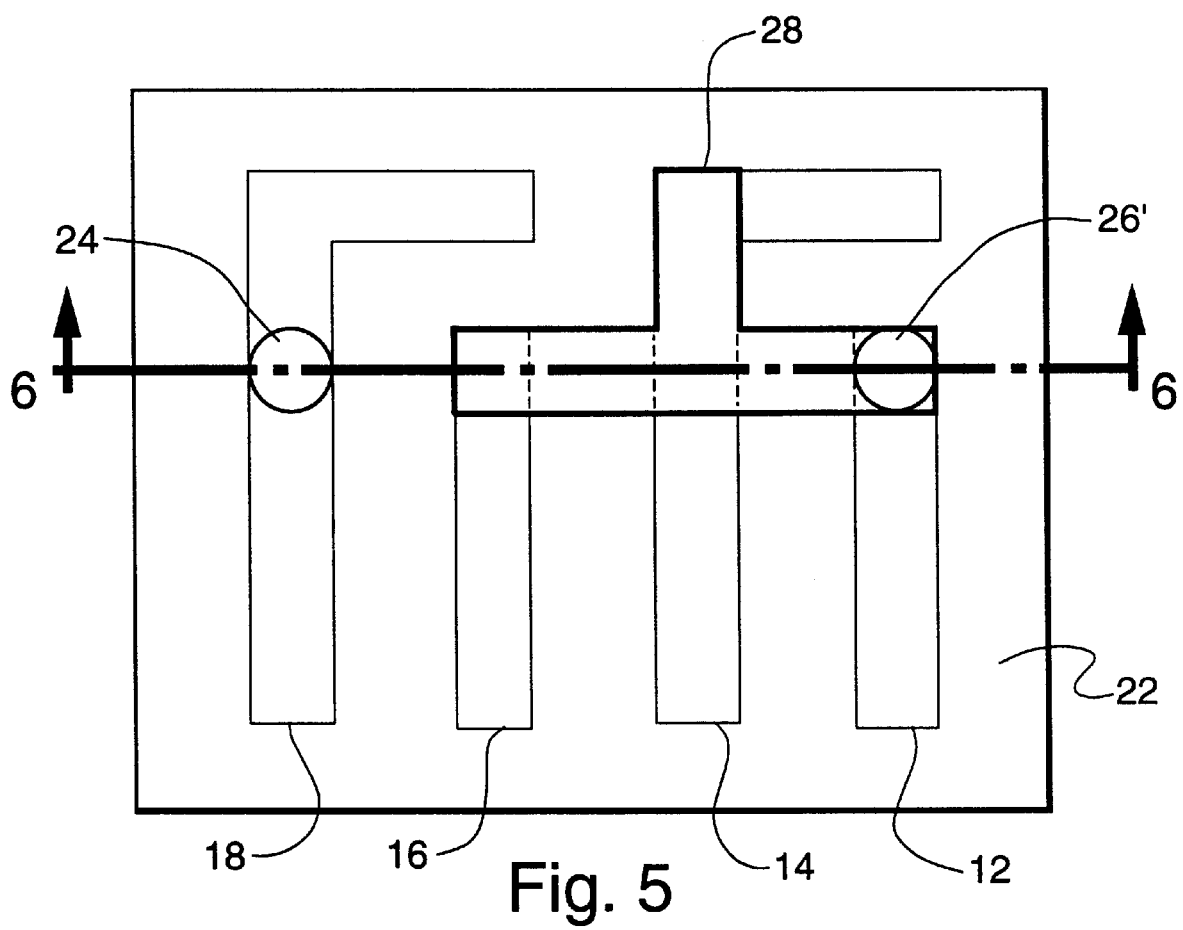

PLANAR INTEGRATED CIRCUIT INTERCONNECT

TECHNICAL FIELD

The present invention relates to the manufacture of semiconductors and, more specifically, to a semiconductor with a low dielectric constant material between intermetallic leads and a process for manufacturing such semiconductors.

BACKGROUND OF THE INVENTION

In semiconductor chip design, the various micro-electrical components that comprise the working components of an integrated circuit are connected together by metal interconnects. The metal interconnects are typically made of copper, aluminum, or some alloy of those metals. The various micro-electrical components include, for example, transistors, capacitors, resistors, and the like.

As complementary metal oxide semiconductor (CMOS) chips (typically silicon) have become more complex, both on-chip interconnects and associated fabrication processes have become critical to the performance, reliability, and cost of integrated circuits. For example, the needs for higher performance and lower cost per chip for successive CMOS generations have led to linear increases in the number of devices, but quadratic increases in the number of interconnects.

To improve the signal speed of logic chips, it is necessary to reduce the dielectric constant of the insulator between the metal lines. Silicon dioxide has preferentially been used as the insulator because it has superior mechanical strength and electrical and chemical integrity. In addition, silicon nitride and silicon dioxide-silicon nitride composites have also been preferred over other insulators because they have excellent insulation properties and low defect levels. These insulators exhibit a high dielectric constant, however, which hinders signal speed.

Recently, attempts have been made to replace the conventional silicon dioxide, silicon nitride, and silicon dioxide-silicon nitride composites with low dielectric constant materials as the dielectric material insulator. Examples of such materials include silicon containing low dielectric constant organic materials, silicon containing low Kappa dielectric (silk, a product of the Dow Corp.), diamond-like carbon, and aerogels (which use microscopically small trapped air bubbles to lower the dielectric constant). The use of low dielectric constant materials reduces the capacitance between the lines (or leads), thus reducing the RC time constant (i.e., the time constant for a series connection of a resistor R and a capacitor C). Unfortunately, these low dielectric insulators cause significant problems. For example, low dielectric materials often have inferior mechanical strength and reduced chemical and thermal conductivity compared to silicon dioxide.

The deficiencies of the conventional processes of reducing the dielectric constant of the insulator between metal lines show that a need still exists for a process which reduces the dielectric constant of the insulator but also retains the mechanical and chemical properties of silicon dioxide. To overcome the shortcomings of the conventional processes, a new process is provided. An object of the present invention is to provide a process for fabricating a semiconductor having a low dielectric constant material between intermetallic leads such that the low dielectric constant material improves signal speed versus typical silicon dioxide, silicon nitride, or silicon dioxide-silicon nitride composite insulators. Another object of the present invention is to provide a semiconductor having a low dielectric constant material between intermetallic leads which exhibits superior mechanical strength and electrical and chemical integrity over conventional low dielectric material insulators.

SUMMARY OF THE INVENTION

To achieve these and other objects, and in view of its purposes, the present invention provides a semiconductor device having a planar integrated circuit interconnect which has a reduced dielectric constant. The circuit interconnect comprises a dielectric material between two levels of line wires, in which the dielectric material has dummy vias filled with a low dielectric material.

The invention also provides a process of fabricating the circuit interconnect described above. The process comprises the following steps. First, a substrate having a first line wire is formed. Next, a dielectric layer is formed on the substrate. A second line wire is then formed in the dielectric layer. Next, a contact via is formed in the dielectric layer which interconnects the first and second line wires. A dummy via, which is filled with a low dielectric material, is then formed. The dummy via extends into the dielectric layer such that it does not contact the first or second line wires.

A second embodiment of the process of the present invention comprises the following steps. First, a substrate is provided having a first line wire formed in the substrate. A dielectric layer is then formed on the substrate. Next, a plurality of recesses are formed which extend into a portion of the dielectric layer, forming precursor contact vias and dummy vias. The recesses are then filled with a low dielectric material. Next, a line wire trench is formed in the dielectric layer such that it does not contact the dummy vias but does contact the precursor contact vias. The precursor contact vias are then etched to the first line wire. Next, the precursor contact vias and line wire trench are filled with a metal, forming contact vias and a second line wire. The final result is a planar integrated circuit interconnect that can be repeated as needed to form the desired number of stacked interconnects.

It is to be understood that both the foregoing general description and the following detailed description are exemplary, but are not restrictive, of the invention.

DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 4 shows in schematic representation the structure of FIG. 3 having recesses partially etched into the dielectric layer;

FIG. 5 shows in schematic representation a top view of the structure of FIG. 4 having a second line wire and a contact via in the dielectric layer;

DETAILED DESCRIPTION OF THE INVENTION

Figure 1:
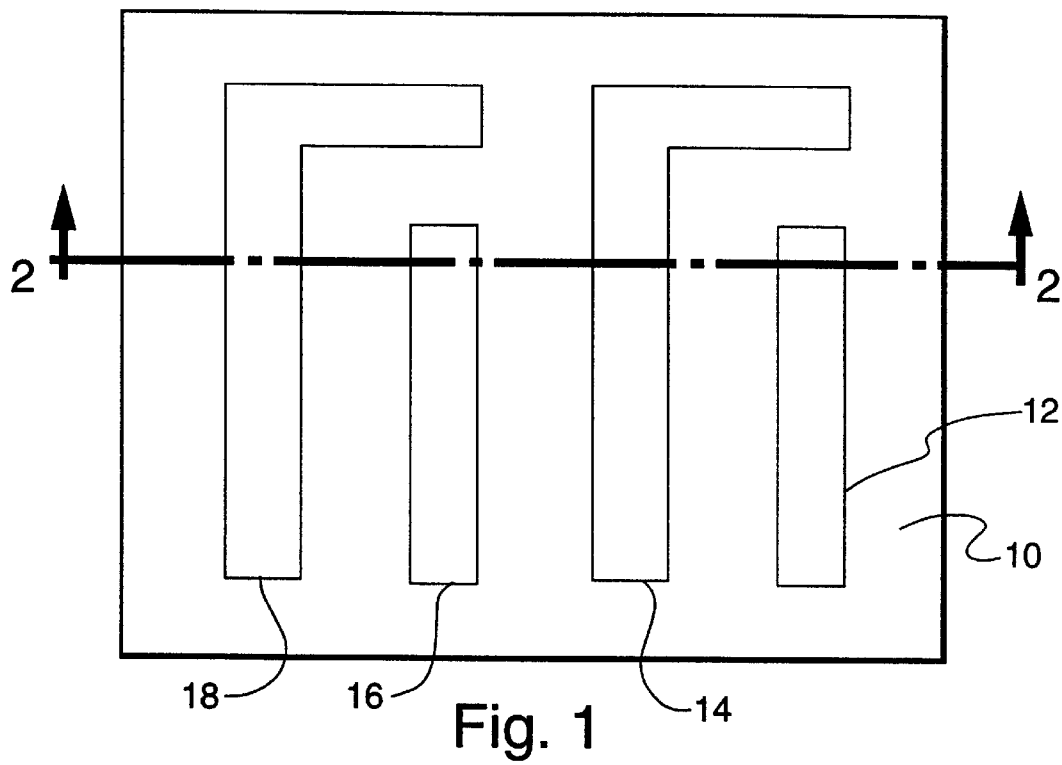
FIG. 1 shows in schematic representation a top view of a substrate having line wires.

The invention will next be described with reference to the drawing in which the same numbers indicate the same elements in all figures. Such figures are intended to be illustrative rather than limiting and are included to facilitate the explanation of the apparatus and process of the present invention.

A damascene process is a process used in some aspects of semiconductor fabrication. It is a process of inlaying a metal into a predefined pattern, typically in a dielectric layer. It is typically performed by defining the desired pattern into a dielectric film; depositing metal over the entire surface by either physical vapor deposition ("PVD"), chemical vapor deposition ("CVD"), or evaporation; then polishing back the top surface in such a way that the top surface is planarized and the metal pattern is only located in the predefined regions of the dielectric layer. The damascene process has been used in manufacturing of metal wiring lines, including the bit-lines for a dynamic random access memory ("DRAM") capacitor.

Damascene technology is a common method of fabricating interconnects. In this context, damascene refers to the steps of patterning an insulator to form recesses, filling the recesses with a metal, and then removing the excess metal above the recesses. This process can be repeated as needed to form the desired number of stacked interconnects. Typically, these damascene structures are laid out in pairs, a process referred to as dual damascene. The present invention relates to both single and dual damascene processes which are described below.

Before application of a damascene process, however, a substrate having line wires and a dielectric layer deposited on the structure is formed. Referring now to the drawing, FIG. 1 illustrates a substrate 10 having a first line wire 12 and line wires 14, 16, and 18 formed in the structure. Substrate 10 is made of those substances conventionally used, such as silicon dioxide, silicon nitride, borophosphosilicate glass (BPSG), phosphosilicate glass (PSG), or combinations of those materials.

First line wire 12 and line wires 14, 16, and 18 are formed in substrate 10 using conventional techniques. Typically, a line wire trench is first etched in the substrate 10. Following formation of the line wire trench, a metal is then deposited in the trench. Next, excess metal above the trench is removed, forming a planar substrate having a line wire. In a preferred embodiment, the metal deposited in the line wire trench is copper, aluminum, or a copper-aluminum composite. In a more preferred embodiment, the metal is copper.

Figure 2:
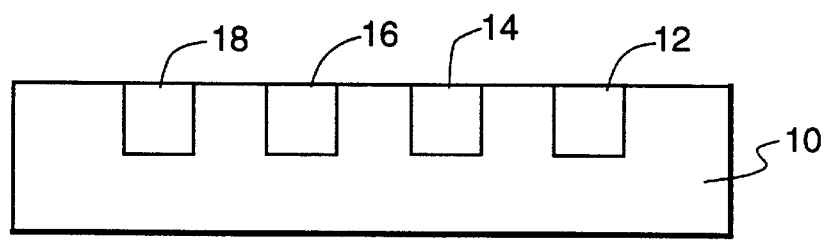
FIG. 2 shows in schematic representation a side view of FIG. 1 taken along the lines 2—2 of FIG. 1.

A schematic elevation cross section taken along line 2—2 of FIG. 1 is illustrated in FIG. 2. FIG. 2 shows first line wire 12 and line wires 14, 16, and 18 in substrate 10.

Figure 3:
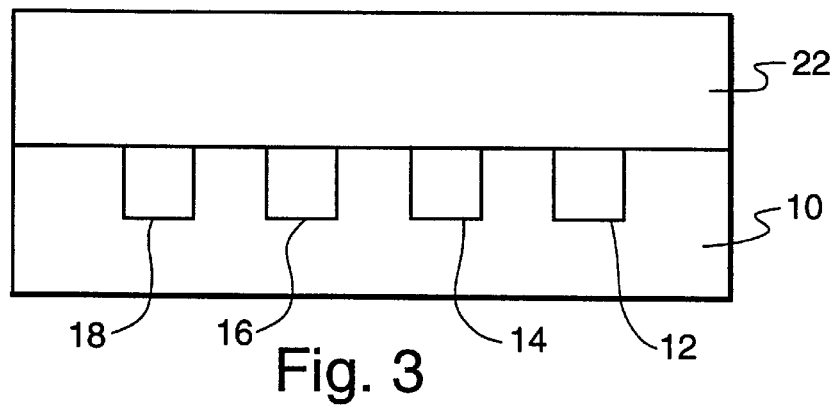
FIG. 3 shows in schematic representation the structure of FIG. 2 having a dielectric layer deposited on the structure.

As illustrated in FIG. 3, following formation of first line wire 12 and line wires 14, 16, and 18 in substrate 10, the next step of the process of the present invention is to form a dielectric layer 22 on substrate 10. Dielectric layer 22 is formed on substrate 10 using conventional techniques. Preferably, dielectric layer 22 is deposited on substrate 10 by CVD. Dielectric layer 22 is selected from those dielectric materials having mechanical strength and electrical and chemical integrity. Preferably, dielectric layer 22 is silicon dioxide, silicon nitride, a silicon dioxide-silicon nitride composite, a silane-based oxide (e.g., tetraethoxysilane or "TEOS"), or a silicate glass (e.g., PSG and BPSG).

Following formation of dielectric layer 22, the subsequent processing steps vary depending on whether single or dual damascene processing is used. These steps are described below.

DUAL DAMASCENE PROCESSING

Turning first to dual damascene processing, two etches are used. The first etch forms recesses that extend partially into the dielectric layer 22. Such recesses are referred to as precursor contact vias and dummy vias. Later, a selective second etch of the precursor contact vias is conducted, resulting in contact with the first line wire 12.

The resulting structure after this first etch of dual damascene processing is illustrated in FIG. 4. As illustrated in this figure, a dummy via 24 and precursor contact via 26 have been formed in dielectric layer 22. A plurality of dummy vias 24, contact vias 26, or both can be formed, depending on the desired dielectric reduction in the dielectric insulation layer and also depending on the degree of interconnection. The recesses forming dummy via 24 and precursor contact via 26 are created using conventional techniques known in the art. Preferably, the recesses are formed using lithography and reactive ion etching (RIE).

After recess formation, the next step in the process of the invention is to fill the recesses with a low dielectric material. The recesses are filled using conventional methods, such as CVD, and they are filled with a dielectric material (referred to as the "low dielectric material") that has a lower dielectric constant than dielectric layer 22. It has been discovered that, by filling the dummy vias 24 with a low dielectric material, the overall dielectric constant of dielectric layer 22 is reduced. In a preferred embodiment, the low dielectric material is polystyrene, silk, organic spin-on glass, or combinations of these materials. In a more preferred embodiment, the low dielectric material is polystyrene.

Figure 6:
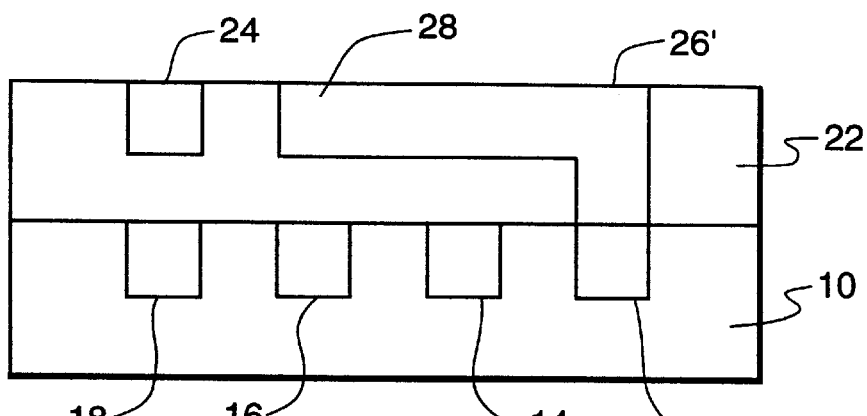
FIG. 6 shows in schematic representation a side view of FIG. 5 taken along the lines 6—6 of FIG. 5.

Next, as illustrated in FIG. 5, a second line wire 28 and a contact via 26' are formed in dielectric layer 22. As shown, the second line wire 28 and contact via 26' are formed such that second line wire 28 contacts contact via 26', but does not contact dummy via 24. This resulting structure is also illustrated in FIG. 6 which is a schematic elevation cross section taken along line 6—6 of FIG. 5. Formation of contact via 26' and second line wire 28 can occur in varying steps.

In a preferred first embodiment, precursor contact via 26 is first etched through dielectric layer 22 to first line wire 12 using conventional methods such as lithography and RIE. During this etch, the low dielectric material in the precursor contact via 26 is removed. A second RIE can optionally be performed to removed any unwanted dielectric material in the precursor contact via 26. Next, a line wire trench is formed in dielectric layer 22 using conventional methods, such as patterning and RIE of the dielectric layer 22. The line wire trench and precursor contact via 26 are then filled with a metal using conventional techniques, such as CVD, producing contact via 26' and second line wire 28. Preferably, the metal is aluminum, copper, tungsten, or a combination of these materials. More preferably, the metal is copper.

In a second embodiment, a line wire trench is first etched in dielectric layer 22, followed by the step of etching both dummy via 24 and precursor contact via 26 through dielectric layer 22 to first line wire 12. Following this etch, dummy via 24 is filled with a low dielectric material. This step requires the selective fill of dummy via 24, and not second line wire 28 or contact via 26'. Conventional methods can be used to selectively block areas other than the dummy via 24. One method involves forming a mask layer over second line wire 28 and contact via 26'. This mask layer acts as a barrier against dielectric material deposition into these areas. Following the selective fill of dummy via 24, the line wire trench and precursor contact via 26 are filled using conventional techniques, such as CVD, and they are filled with a metal to form contact via 26' and second line wire 28. Preferably, the metal is aluminum, copper, tungsten, or a combination of these materials. More preferably, the metal is copper.

After forming the second line wire 28 and contact via 26', excess metal can be polished using conventional methods, such as chemical-mechanical polishing (CMP), to create a planar structure.

SINGLE DAMASCENE PROCESSING

Figure 7:
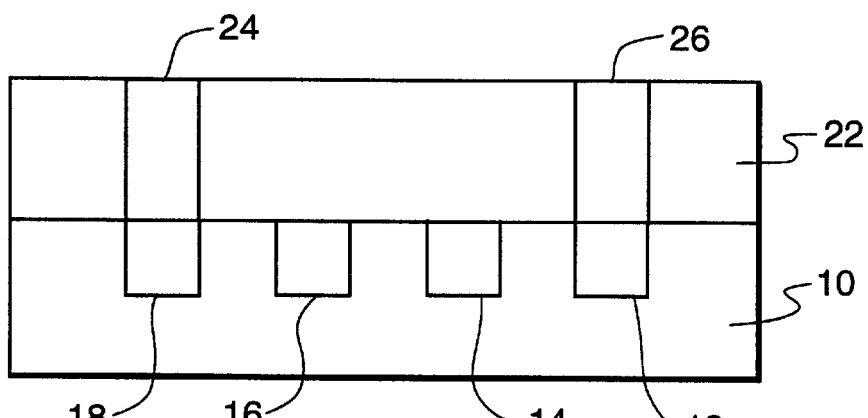
FIG. 7 shows in schematic representation the structure of FIG. 3 having recesses etched through the dielectric layer to the first line wire.

As illustrated in FIG. 7, single damascene processing differs from dual damascene processing in that the recesses are etched down to first line wire 12 and, in a single etch, produce dummy via 24 and precursor contact via 26. As described above with respect to dual damascene processing, a plurality of dummy vias 24, precursor contact vias 26, or both can be formed, depending on the desired dielectric reduction in the dielectric insulation layer and also depending on the degree of interconnection, respectively. The recesses are formed using conventional techniques, such as using lithography and RIE.

Following formation of dummy via 24 and precursor contact via 26, the dummy via 24 is filled with a low dielectric material. This step requires a selective fill of the dummy via 24 only, and not the precursor contact via 26, with a dielectric material. Conventional methods can be used to selectively block areas other than the dummy via 24. One method involves forming a mask layer over the precursor contact vias 26. This mask layer acts as a barrier against dielectric material deposition in areas other than the dummy vias 24.

Similar to the process described above for dual damascene processing, the dielectric material should have a lower dielectric constant than dielectric layer 22. This configuration reduces the overall dielectric constant of dielectric layer 22. Preferably, the low dielectric material is polystyrene, silk, organic spin-on glass, diamond-like carbon, or combinations of those materials. More preferably, the low dielectric material is polystyrene.

Next precursor contact via 26 is filled with a metal using conventional techniques, such as CVD, to form contact via 26'. Preferably, the metal is aluminum, tungsten, copper, or a combination of these metals. More preferably, the metal is tungsten.

Figure 8:
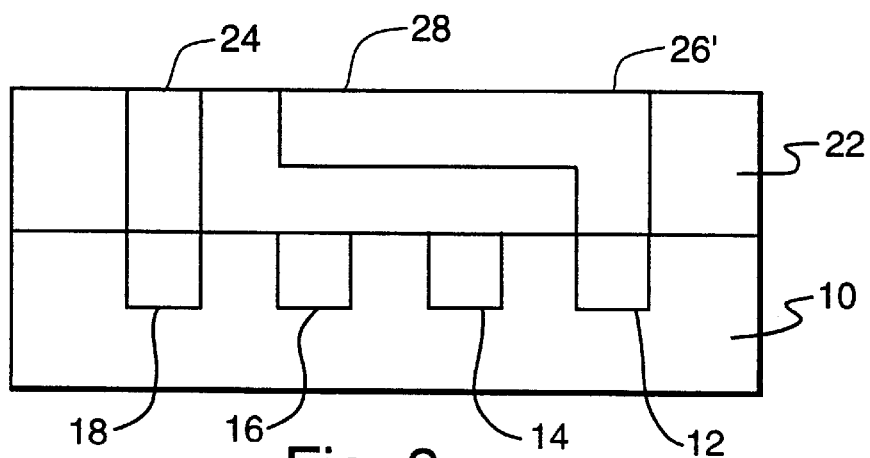
FIG. 8 shows in schematic representation the structure of FIG. 7 having a second line wire in contact with a contact via which extends through the dielectric layer to the first line wire.

As illustrated in FIG. 8, following formation of dummy via 24 and contact via 26', a second line wire 28 is formed in dielectric layer 22. Second line wire 28 is formed in such a way that it contacts contact via 26' but does not contact dummy via 24. Second line wire 28 can be formed by depositing a blanket layer of metal on the dielectric layer 22. Next, the unwanted metal is removed using conventional techniques, such as lithography and metal RIE, to form second line wire 28.

Preferably, second line wire 28 is formed by the following steps. First, a line wire trench is created by lithography and RIE of dielectric layer 22. The line wire trench is then filled with a metal using conventional methods, such as CVD, resulting in second line wire 28. Preferably, the metal is aluminum, copper, or a combination of these metals. More preferably, the metal is copper.

Figure 9:
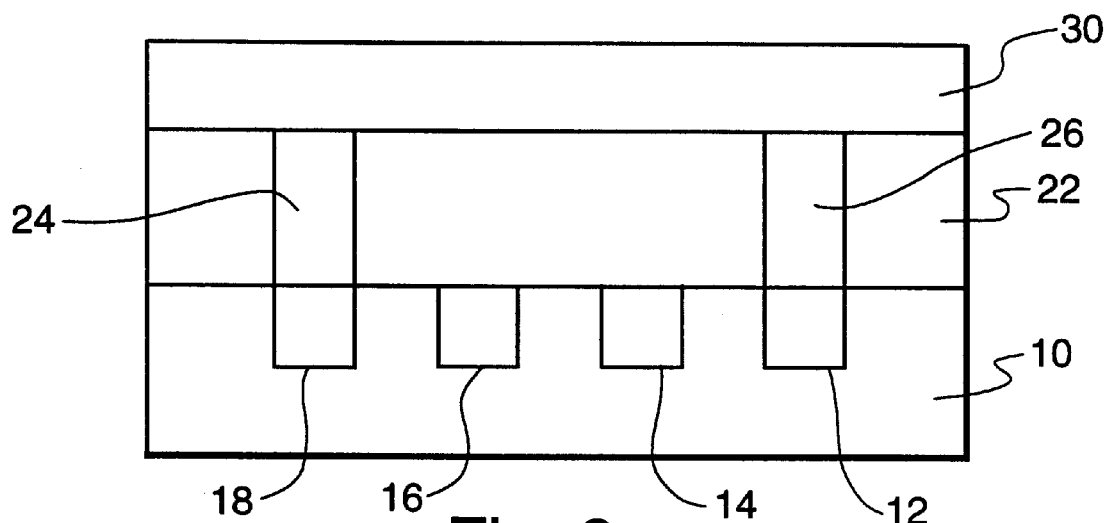
FIG. 9 shows in schematic representation the structure of FIG. 7 having a second dielectric layer formed on the structure.
Figure 10:
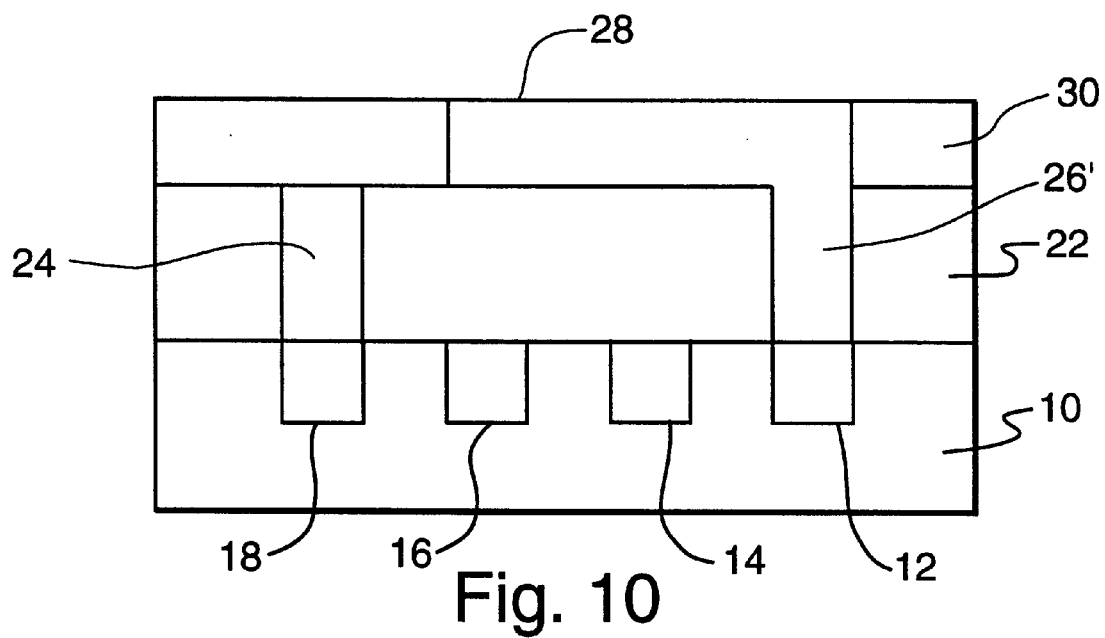
FIG. 10 shows in schematic representation the structure of FIG. 9 having a second line wire in contact with a contact via which extends through the dielectric layer to the first line wire.

In a preferred embodiment, illustrated in FIG. 9, a second dielectric layer 30 is deposited on dielectric layer 22. The second line wire 28 is then formed in second dielectric layer 30. Second dielectric layer 30 is selected from those dielectric materials having mechanical strength and chemical integrity. Preferably, the dielectric material is silicon dioxide or a silicon dioxide-silicon nitride composite structure in which a thin layer of silicon nitride is first deposited. FIG. 10 illustrates the resulting structure.

Similar to dual damascene processing, after forming the second line wire 28 and contact via 26', the structure is planarized. Excess metal can be planarized by conventional methods, such as CMP, to create a planar structure. Whether the single or dual damascene process is used, therefore, the process of the present invention yields a planar integrated circuit interconnect. This process can be repeated as needed to form the desired number of stacked interconnects.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A semiconductor device having a planar integrated circuit interconnect, the device comprising:

a substrate having a first line wire formed in the substrate;

a dielectric layer formed on the substrate;

a second line wire formed in the dielectric layer;

a contact via formed within the dielectric layer wherein the contact via interconnects the first line wire and the second line wire;

a dummy via extending into the dielectric layer such that the dummy via does not contact the first line wire or the second line wire; and a low dielectric material filling the dummy via.

2. The semiconductor device of claim 1 wherein the first line wire comprises a material selected from the group consisting of copper, aluminum, and combinations of copper and aluminum.

3. The semiconductor device of claim 1 wherein the dielectric layer is selected from the group consisting of silicon dioxide, silicon nitride, a silicon dioxide-silicon nitride composite, a silane-based oxide, and a silicate glass.

4. The semiconductor device of claim 1 wherein the second line wire comprises a material selected from the group consisting of copper, aluminum, and combinations of copper and aluminum.

5. The semiconductor device of claim 1 wherein the contact via comprises a material selected from the group consisting of copper, aluminum, tungsten, and combinations of those metals.

6. The semiconductor device of claim 1 wherein the low dielectric material is selected from the group consisting of polystyrene, silk, organic spin-on glass, diamond-like carbon, and combinations of those materials.

7. The semiconductor device of claim 6 wherein the low dielectric material is polystyrene.

8. A semiconductor device having a planar integrated circuit interconnect, the device comprising:

a substrate having a first line wire formed in the substrate;

a dielectric layer formed on the substrate;

a second line wire formed on the dielectric layer;

a contact via formed within the dielectric layer wherein the contact via interconnects the first line wire and the second line wire;

a dummy via extending through the dielectric layer to the first line wire such that the dummy via does not contact the second line wire; and a low dielectric material filling the dummy via.

9. The semiconductor device of claim 8 wherein the low dielectric material is selected from the group consisting of polystyrene, silk, organic spin-on glass, diamond-like carbon, and combinations of those materials.

10. The semiconductor device of claim 8 further comprising a second dielectric layer formed on the dielectric layer, wherein the second line wire is formed in the second dielectric layer.

* * * * *